United States Patent
Takano et al.

(10) Patent No.: US 7,195,863 B2
(45) Date of Patent: *Mar. 27, 2007

(54) DEVELOPMENT DEFECT PREVENTING PROCESS AND MATERIAL

(75) Inventors: Yusuke Takano, Shizuoka (JP); Kazuyo Ijima, Shizuoka (JP); Satoru Funato, Shizuoka (JP); Yoshio Murakami, Shizuoka (JP); Hatsuyuki Tanaka, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 25 days.

This patent is subject to a terminal disclaimer.

(21) Appl. No.: 10/311,787

(22) PCT Filed: Jun. 14, 2001

(86) PCT No.: PCT/JP01/05072

§ 371 (c)(1),
(2), (4) Date: Dec. 18, 2002

(87) PCT Pub. No.: WO02/01299

PCT Pub. Date: Jan. 3, 2002

(65) Prior Publication Data

US 2003/0180667 A1    Sep. 25, 2003

(30) Foreign Application Priority Data

Jun. 26, 2000    (JP)    ............... 2000-191364

(51) Int. Cl.
*G03F 7/30*    (2006.01)
*G03F 7/38*    (2006.01)

(52) U.S. Cl. ............ 430/327; 430/270.1; 430/326; 430/330

(58) Field of Classification Search ............ 430/273.1, 430/330, 271.1, 326, 270.1, 327, 331, 272.1
See application file for complete search history.

(56) References Cited

U.S. PATENT DOCUMENTS

| | | | |
|---|---|---|---|
| 4,833,067 A | 5/1989 | Tanaka et al. ............. 430/331 |
| 5,529,888 A | 6/1996 | Watanabe et al. ........... 430/331 |
| 5,541,037 A | 7/1996 | Hatakeyama et al. .... 430/273.1 |
| 5,611,850 A * | 3/1997 | Nishi et al. ............. 106/287.26 |
| 5,698,357 A * | 12/1997 | Inoue et al. ............. 430/108.6 |
| 5,853,471 A * | 12/1998 | Yoshida et al. ........ 106/287.13 |
| 6,309,789 B1 * | 10/2001 | Takano et al. ........... 430/270.1 |
| 6,472,127 B1 | 10/2002 | Takizawa .................. 430/322 |
| 6,605,417 B2 * | 8/2003 | Nitta et al. ................ 430/326 |
| 2004/0101780 A1 * | 5/2004 | Maemoto ................. 430/273.1 |
| 2004/0137344 A1 * | 7/2004 | Yamashita et al. ........... 430/45 |

FOREIGN PATENT DOCUMENTS

| | | |
|---|---|---|
| EP | 0 522 990 | 1/1993 |
| JP | 8-15859 | 1/1996 |
| JP | 5-326389 | 10/1998 |
| JP | 2000-10294 | 1/2000 |
| JP | 2001-133984 | 5/2001 |

OTHER PUBLICATIONS

English abstract for JP 61-179435, Aug. 12, 1986.
English abstract for JP 6-148896, May 27, 1994.
English abstract for JP 7-140668, Jun. 2, 1995.
English abstract for JP 9-246166, Sep. 19, 1997.
English abstract for JP 9-325500, Dec. 16, 1997.
English abstract for JP 2000-275835, Oct. 6, 2000.
Ito, Hiroshi, et al., "Chemical amplification in the design of dry developing resist materials", Polymer Engineering and Science, 1983, vol. 23, No. 18, pp. 1012-1018.
Feely, Wayne E., et al., "The role of the latent image in a new dual image, aqueous developable, thermally stable photoresist", Polymer Engineering and Science, Mid- Sep. 1986, vol. 26, No. 16, pp. 1101-1104.
English Language Abstract of JP 5-326389.
English Language Abstract of JP 8-15859.
English Language Abstract of JP 2000-10291.
English Language Abstract of JP 2001-133984.

* cited by examiner

*Primary Examiner*—John S. Chu
(74) *Attorney, Agent, or Firm*—Sangya Jain

(57) ABSTRACT

A composition for reducing development defects comprising an acidic composition containing, for example, a surfactant applied onto a chemically amplified photoresist coating formed on a substrate having a diameter of 8 inches or more. By this process, the surface of the resist is rendered hydrophilic and the formation of slightly soluble layer in a developer on the surface of the resist is prevented. In addition, by proper diffusion amount of acid from the composition for reducing development defects, the amount of reduction in thickness of the chemically amplified photoresist coating after development is increased by 10 Å to 500 Å in comparison with the case of not applying the composition for reducing development defects to form a resist pattern not having a deteriorated pattern profile such as T-top or round top.

7 Claims, No Drawings

DEVELOPMENT DEFECT PREVENTING PROCESS AND MATERIAL

TECHNICAL FIELD

This invention relates to a process for forming a resist pattern having less development defects and good profiles using a chemically amplified photoresist, and to a composition for reducing development defects used in this process. More particularly, it relates to a process for forming a resist pattern which can form a resist pattern with good profiles by patternwise exposing a large-diameter substrate having formed thereon a chemically amplified photoresist coating, with preventing generation of development defects all over the large-diameter substrate, and to a composition for reducing development defects used in this process.

BACKGROUND ART

In manufacturing semiconductor elements, lithographic technology has been employed in which a photoresist coating is formed on a substrate such as a silicon wafer and, after selectively irradiating this with actinic rays, is subjected to development processing to thereby form a resist pattern on the substrate.

In recent years, in order to attain much higher degree of integration in LSI, patterning technology to form patterns with a finer line width by a lithographic process has made a rapid progress. For forming a pattern with a finer line width, various proposals have been made with respect to all steps of the lithography and all materials to be used therein including photoresists, antireflective coatings, exposing methods, exposing apparatus, developing agents, developing processes and developing apparatus. For example, Japanese Patent No. 2643056 and Japanese Unexamined Patent Publication No. H7-181685 describe that an antireflective surface layer containing a fluorine-containing compound with a low refractive index is formed on a resist layer to thereby prevent detrimental influences of reflected light from the resist surface on formation of a resist pattern. To form an antireflective layer on a resist layer provides the advantage that, since degree of vibration amplitude of the thickness of a resist coating vs. sensitivity curve becomes smaller, fluctuation in sensitivity of resist becomes smaller even when thickness of the resist layer fluctuates, which leads to a decreased fluctuation in dimension of resist patterns formed. In addition, antireflective surface layer serves to decrease standing wave to be caused by interference between incident light and reflected light or between one reflected light and another reflected light. Recently, technology of forming a resist pattern having a desired line width without providing the antireflective surface layer has also been developed. For example, an underlying substrate is made plane to depress fluctuation in dimension due to fluctuation in thickness of the resist layer as described above, or a mask pattern is finely adjusted according to fluctuation in dimension of the resist.

With regard to exposing apparatus, there has been proposed a process of using a light source emitting radiation of a short wavelength, which is advantageous for forming a finer pattern, such as deep UV rays of KrF excimer laser (248 nm) or ArF excimer laser (193 nm) or, further, X rays or electron beams, and some of them have been coming into practice.

On the other hand, improvement in the yield of semiconductor integrated circuits has occupied the attention as an extremely important matter in manufacturing them. There exist many factors that decide the yield of semiconductor integrated circuits. One of the factors is patterning failure upon forming a pattern using a resist. This patterning failure of a resist pattern is caused, for example, by dust existing in or on the surface of the resist, by deterioration of the resist due to floating chemical species in a clean room, by coating failure of the resist or the like, or by development failure. As an example of deterioration due to chemical species in a clean room, there is illustrated that which is caused in the process using a chemically amplified photoresist. In this process, the chemically amplified photoresist is so susceptible to the influence of acidic substances, basic substances and moisture in the atmosphere that there results a change in dimension of a pattern—for example, a T-topped resist pattern results when a positive-working photoresist is used, or a round-topped resist pattern results when a negative-working photoresist is used—in case when the period between patternwise exposure to PEB (post exposure bake) is prolonged or due to intermixing with a resist.

In addition, defects upon developing a resist coating have become a problem. For example, there are illustrated scumming in line-and-space type resists and opening failure in contact hole type resists. Several causes may be considered for the opening failure of contact holes, but the most popular opening failure is that which is caused by residues after development. As the causes for these defects, there is illustrated insufficient dissolution of exposed portions into a developing solution due to insufficient contact between the developing solution containing water as a major component and the surface of a resist upon bringing the developing solution into contact with the resist surface, which leads to opening failure of portions which are designed to open. It is also possible that insolubles for the developing solution might re-deposit onto the surface of the resist upon rinsing with water after development.

Further, it is necessary to enhance contrast of a resist in order to form a finer pattern. In general, in order to improve contrast of a contact hole type resist, a technique of increasing a protecting ratio of hydrophilic groups in a major component polymer is used with respect to, for example, positive-working chemically amplified photoresists. However, when the protecting ratio is increased, the resist surface is liable to become hydrophobic, leading to deterioration in wetting properties for the developing solution.

Various investigations have been conducted to solve the above-described problems. For example, Japanese Unexamined Patent Publication No. H9-246166 proposes to treat the surface of a photoresist with plasma to thereby render the surface hydrophilic, thus improving wetting properties of the resist for a developing solution and decreasing development defects. This technique, however, requires introduction of an additional apparatus for the plasma treatment and involves the problem of decrease in throughput.

In addition, various attempts for decreasing the development defects by optimizing development sequence have been made as well. For example, Japanese Examined Patent Publication No. H4-51020 describes to improve wetting properties of a positive-working resist for a developing solution by adding an acetylenealcohol type surfactant to the developing solution, thereby forming a pattern having no development defects. Although some effects can be obtained by this technique, the effects are at present still insufficient in ultra-fine working using the aforesaid chemically amplified photoresists. In addition, Japanese Unexamined Patent Publication No. S61-179435 describes to optionally conduct surface coating, which is effective for improving wetting properties for a developing solution, in addition to the method of adding a surfactant to the developing solution and the method of plasma-treating the surface of a resist coating, for preventing development defects resulting from lack of wetting properties for the developing solution.

However, particularly in case when surface coating for decreasing the development defects is conducted on a chemically amplified photoresist, there results a T-topped pattern if the surface coating composition contains a compound, such as a basic compound, which deactivates an acid generated at patternwise exposure. On the other hand, in case when this surface coating gives an excess amount of acid to the photoresist layer, there results an extreme reduction in thickness of coating in unexposed portions, which might lead to formation of a round topped resist pattern which constitutes an obstacle in an etching process.

Further, problems in attaining uniform thickness of coating and uniform development to be caused with a recent increase in diameter of a substrate such as a silicon wafer are said to make it difficult to form a finer pattern. For example, a paddle developing method has so far been popularly employed for developing a resist coating on the silicon wafer. In the paddle developing method, a developing solution is dropped onto a resist coating formed on a substrate, and the substrate is spun to form a thin film of the developing solution all over the resist coating, thus development of the resist coating being conducted. However, there generates a difference in circumferential speed between the central portion and the peripheral portion of the substrate, thereby a difference in speed of the coating generating. Thus, developing conditions become different between the central portion of the wafer and the peripheral portion thereof. In this situation, particularly when a chemically amplified photoresist is used as a resist and a large-diameter substrate having a diameter of 8 inches or more is used, development defects in the peripheral portion are caused in some cases which have not conventionally been observed in treating a resist coating formed on a substrate having a diameter of 6 inches or less.

Therefore, in order to improve a yield in manufacturing semiconductor integrated circuits and so on, a process for forming a resist pattern has been desired earnestly which enables one to reduce development defects to be caused upon development including development defect to be caused in the periphery of a chemically amplified photoresist formed on a larger diameter substrate such as a silicon wafer, and which does not cause pattern failure such as T-top or round top after development, thus being adapted for forming a finer resist pattern.

In consideration of the above-described situation, an object of the present invention is to provide a process for forming a resist pattern which can reduce development defects of a chemically amplified photoresist, formed on a large diameter substrate having a diameter of 8 inches or more, to be caused upon development and which does not cause deterioration of pattern profiles such as T-top or round top inconvenient for an etching step due to detrimental influences of a processing atmosphere and intermixing between the surface coating and the resist, and a composition for reducing development defects in this process.

DISCLOSURE OF THE INVENTION

As a result of intensive investigations, the inventors have found that the above-described object can be attained by increasing the amount of reduction in thickness of a resist after development in comparison with the case of not coating a composition for reducing development defects in a pattern-forming process wherein the composition for reducing development defects is applied on a chemically amplified photoresist coating formed on a substrate in order to render the surface of photoresist hydrophilic, followed by patternwise exposure and development to obtain a resist pattern, thus having achieved the present invention based on the finding.

That is, the present invention is a process for forming a resist pattern which includes: a step of forming a chemically amplified photoresist coating on a substrate having a diameter of 8 inches or more by application; a step of applying a composition for reducing development defects on the chemically amplified photoresist coating; a step of baking after at least either the step of forming the chemically amplified photoresist coating by application or the step of applying the composition for reducing development defects; a step of selectively exposing the chemically amplified photoresist coating; a step of post-exposure baking the chemically amplified photoresist coating; and a step of developing the chemically amplified photoresist coating, and which increases the amount of reduction in thickness of the chemically amplified photoresist coating after development by 10 Å to 500 Å in comparison with the case of not applying the composition for reducing development defects.

In addition, the present invention is a composition for reducing development defects which is composed of an acidic composition containing a surfactant and which is to be used for the process for forming a resist pattern which includes: a step of forming a chemically amplified photoresist coating on a substrate having a diameter of 8 inches or more by application; a step of applying a composition for reducing development defects on the chemically amplified photoresist coating; a step of baking after at least either the step of forming the chemically amplified photoresist coating by application or the step of coating the composition for reducing development defects; a step of selectively exposing the chemically amplified photoresist coating; a step of post-exposure baking the chemically amplified photoresist coating; and a step of developing the chemically amplified photoresist coating, and which increases the amount of reduction in thickness of the chemically amplified photoresist coating after development by 10 Å to 500 Å in comparison with the case of not applying the composition for reducing development defects.

The present invention is described in more detail below.

In the process of the present invention for forming a resist pattern, it is necessary to increase the amount of reduction in thickness of the chemically amplified photoresist after development by 10 Å to 500 Å in comparison with the case of not coating the composition for reducing development defects. In the present invention, the chemically amplified photoresist may be either of positive-working and negative-working types. The composition for reducing development defects to be used in the present invention preferably contains a surfactant and, when the chemically amplified photoresist is positive-working, the composition for reducing development defects is preferably acidic. PH of the composition is preferably 1.5 to 4.5, more preferably 1.7 to 3.5. In addition, when the chemically amplified photoresist is negative-working, the composition is preferably weakly acidic to alkaline.

As the surfactant to be used in the composition of the present invention for reducing development defects, industrially utilized organic acids or the amine or ammonium salts thereof are preferably used. As the organic acid, functional fluorocarbon compounds are preferred. Of the functional fluorocarbon compounds, $C_4$ to $C_{15}$ perfluoroalkylcarboxylic acids and the ammonium salts, tetramethylammonium salts or $C_1$ to $C_4$ alkanolamine salts thereof; $C_4$ to $C_{10}$ perfluoroalkylsulfonic acids and the ammonium salts, tetramethylammonium salts or $C_1$ to $C_4$ alkanolamine salts thereof; fluorinated alkyl quaternary ammonium iodides; and perfluoroadipic acid and the quaternary ammonium salts thereof are preferred, with tetramethylammonium salts of $C_7$ to $C_{10}$ perfluoroalkylcarboxylic acids, $C_4$ to $C_8$ perfluoroalkylsulfonic acids and the $C_1$ to $C_4$ alkanolamine salts thereof being more preferred. As the amine salts or ammonium salts of the organic acids, previously prepared salts may be used, or those formed by mixing an organic acid and a base such as an amine or ammonia in an aqueous solution may be used as well.

These surfactants are used as a 0.1 wt %–25 wt %, more preferably 2 wt %–4 wt % aqueous solution for the composition for reducing development defects. In this situation, it is preferred to optimize the amount of reduction in thickness of the resist layer by properly adjusting the mixing ratio of the organic acid to the base such as amine or ammonia or adjusting basicity of the composition in consideration of the kind of a chemically amplified photoresist to be used or processing conditions. That is, in the case of using, for example, a positive-working photoresist as the chemically amplified photoresist, it suffices to adjust, upon using a salt between the organic acid and the amine or ammonium as the surfactant, the mixing ratio of the organic acid to the amine or ammonium so that pH of the composition for reducing development defects becomes at an optimal pH within the above-described range. It has been found that, in this mixing, better results can often be obtained when the organic acid is used in an amount more than the equivalent amount of the base, than when the surfactant is wholly composed of the organic acid or the salt between the organic acid and the amine or ammonium. Thus, optimal results can be obtained by adjusting the amount of reduction in thickness of resist coating upon development through adjustment of the mixing ratio of the organic acid to the base such as amine or ammonia to thereby properly adjust pH depending upon kind of the chemically amplified photoresist to be used or processing conditions. In the composition for reducing development defects to be applied to a positive-working chemically amplified photoresist, the ratio of the organic acid to the base (for example, amine) is usually about 7:0–7:6 in molar ratio, preferably about 7:4–7:6, more preferably about 7:5. In terms of organic acid: salt, the molar ratio is usually about 7:0–1:6, preferably about 3:4–1:6, more preferably about 2:5.

To the composition of the present invention for reducing development defects may further be added, if necessary, water-soluble resins and various additives within amounts not spoiling performance of the composition.

As the water-soluble resin to be used in the composition for reducing development defects of the present invention, there may be illustrated, for example, poly(vinyl alcohol), poly(acrylic acid), poly(vinylpyrrolidone), poly(α-trifluoromethylacrylic acid), poly(vinyl methyl ether-co-maleic anhydride), poly(ethylene glycol-co-propylene glycol), poly(N-vinylpyrrolidone-co-vinyl acetate), poly(N-vinylpyrrolidone-co-vinyl alcohol), poly(N-vinylpyrrolidone-co-acrylic acid), poly(N-vinylpyrrolidone-co-methyl acrylate), poly(N-vinylpyrrolidone-co-methacrylic acid), poly(N-vinylpyrrolidone-co-methyl methacrylate), poly(N-vinylpyrrolidone-co-maleic acid), poly(N-vinylpyrrolidone-co-dimethyl maleate), poly(N-vinylpyrrolidone-co-maleic anhydride), poly(N-vinylpyrrolidone-co-itaconic acid), poly(N-vinylpyrrolidone-co-methyl itaconate), poly(N-vinylpyrrolidone-co-itaconicanhydride, and fluorinatedpolyether, withpoly(acrylic acid), poly(vinylpyrrolidone) and fluorinated polyether being particularly preferred.

As the additives to be used in the composition for reducing development defects of the present invention, there may be illustrated, for example, surfactants to be added for improving coating properties, such as nonionic surfactants, anionic surfactants and amphoteric surfactants. The nonionic surfactants are exemplified by polyoxyethylene alkyl ethers such as polyoxyethylene lauryl ether, polyoxyethylene oleyl ether and polyoxyethylene cetyl ether, polyoxyethylene fatty acid diesters, polyoxyfatty acid monoester, polyoxyethylene-polyoxypropylene block polymer, and acetylene glycol derivatives, the anionic surfactants are exemplified by alkyldiphenyl ether disulfonic acids and the ammonium salts or organic amine salts thereof, alkyldiphenyl ether sulfonic acids and the ammonium salts or organic amine salts thereof, alkylbenzenesulfonic acids and the ammonium salts or organic amine salts thereof, polyoxyethylene alkyl ether sulfuric acids and the ammonium salts or organic amine salts thereof, and alkyl sulfuric acids and the ammonium salts or organic amine salts thereof, and the amphoteric surfactants are exemplified by 2-alkyl-N-carboxymethyl-N-hydroxyethyl-imidazolinium betaine and laurylamidopropyl hydroxysulfone betaine.

Further, as water to be used in the composition for reducing development defects of the present invention, water from which organic impurities, metal ions, etc. have been removed by distillation, ion-exchange treatment, treatment through filter or various adsorption treatments are preferably used.

Additionally, in order to improve coating properties, a water-soluble organic solvent may be used together with water. The water-soluble organic solvent is not particularly limited as long as it can be soluble in water in a concentration of 0.1 wt % or more. Examples of the organic solvent include alcohols such as methyl alcohol, ethyl alcohol and isopropyl alcohol, ketones such as acetone and methyl ethyl ketone, esters such as methyl acetate and ethyl acetate, and polar solvents such as dimethylformamide, dimethylsulfoxide, methyl cellosolve, cellosolve, butyl cellosolve, cellosolve acetate, butylcarbitol and carbitol acetate. These specific examples are merely illustrated as examples of the organic solvents, and the organic solvents to be used in the present invention are not limited only to these solvents.

In addition, optimization of reduction in thickness of resist coating in the present invention may also be attained by properly adjusting baking time or baking temperature of the resist and the composition for reducing development defects as well as optimization by the composition itself for reducing development defects. As to the prebaking temperature for the resist, there are generally two types in accordance with photoresist compositions to be used. That is, one type requires a high energy and generally requires to bake at a temperature of about 100 to 150° C., and another type does not require so much energy in comparison with the former and requires to bake at a temperature of 100° C. or lower. In addition, prebaking temperature for the composition for reducing development defects is generally 60 to 100° C. which is high enough to remove the solvent. Further, post-exposure baking of the resist is generally about 100 to 150° C. For example, in case when T-tops are formed after development, formation of such T-tops can be in some cases avoided by such combination of baking temperatures for the resist and the composition for reducing development defects that resist-prebaking temperature is set at a lower level while prebaking temperature for the composition for reducing development defects at a level of 100° C. or higher. In addition, too much reduction in thickness of the resist coating disadvantageous in an etching step can be avoided by optionally delaminating or dissolving away the composition for reducing development defects after exposure.

Thickness of the coating of the composition for reducing development defects in the present invention may be such that it provides enough chemical action to more reduce thickness of the resist coating in comparison with the case of not applying the composition for reducing development defects, and is preferably 80 to 10000 Å, more preferably 330 to 990 Å. Coating of the composition for reducing development defects can be conducted by any of known coating methods such as a spin coating method.

The chemically amplified photoresist to be used in the present invention as a resist may be any of known positive-working and negative-working chemically amplified photoresists. As the positive-working chemically amplified photoresist, there are known a number of ones including that which is composed of a combination of a polymer wherein polyhydroxystyrene is protected with t-butoxycarbonyl group and a photo acid generator (see, H. Ito, and C. G. Willson: Polym. Eng. Sci., 23, 1012 (1983)). Also, as the negative-working chemically amplified photoresist, there may be illustrated, for example, that which is composed of an alkali-soluble resin, a cross-linking agent of hexamethoxymelamine and a photo acid generator (for example, see, W. E. Feely, J. C. Imhof, C. M. Stein, T. A. Fisher and M. W. Legenza: Polym. Eng. Sci., 26, 1101(1986)). Of these, positive-working chemically amplified photoresists are preferred in the present invention. Thickness of the coating may be such that a resist pattern obtained after development can suitably exert its performance during etching in the etching step, and is generally about 0.3 to 1.0 μm.

The pattern-forming method of the present invention can favorably be applied upon formation of a pattern on a substrate having a diameter of 8 inches or more. As the substrate, a silicon substrate is common, but may of course be those wherein a metal layer or a oxide or nitride layer such as silicon oxide, silicon nitride or silicon oxide nitride is formed on silicon. In addition, the substrate itself is not limited to silicon but may be any of substrate materials having so far been used for manufacturing IC such as LSI.

As to the method for coating the chemically amplified photoresist, baking of the chemically amplified photoresist layer and the layer of reducing development defect compositions, exposing method, developing agents, and developing methods, any ones or any conditions having so far been employed for forming a resist pattern using a chemically amplified photoresist may be employed. Further, as an exposing light source to be used in the exposing step, any of UV rays, deep UV rays, X rays and electron beams may be used.

BEST MODE FOR PRACTICING THE INVENTION

The present invention will now be described more specifically by reference to Examples which, however, are not to be construed to limit the present invention in any way. Additionally, in the following Examples, "parts" are by weight unless otherwise specified.

EXAMPLE 1

3 parts of perfluorooctanesulfonic acid, 0.35 part of 2-aminoethanol and 1 part of polyvinylpyrrolidone having a molecular weight of 45,000 were dissolved uniformly in 95.65 parts of pure water at the room temperature, and the resultant mixture was passed through a 0.05-μm filter to obtain a composition for reducing development defects. This composition for reducing development defects had a pH of about 2.3.

Separately, a positive-working chemically amplified photoresist containing a p-hydroxystyrene derivative was applied on an 8-inch silicon wafer in a varying thickness. Thus, there were prepared wafers having coated thereon the photoresist coating in a varying thickness of from about 0.67 μm to 0.81 μm after being prebaked. The prebaking was conducted at 90° C. for 90 seconds. Thereafter, the above-described composition for reducing development defects was applied on each of the wafers in a thickness of 440 Å (without baking). Exposure was conducted using a halftone phase shift mask for contact hole having a mask size of 0.28 μm. FPA3000EX5 made by Canon Co., Ltd. was used for conducting the exposure. After conducting PEB at 120° C. for 90 seconds, each wafer was development processed for 60 seconds in a 2.38% TMAH (tetramethylammonium hydroxide). In the development processing, E2 nozzles were used employing a soft impact method. Of the patterns thus formed, patterns of 0.20 μm in hole diameter and 1:1, 1:3 or 1:5 in hole-to-hole distance were observed under CD-SEM, S9200 made by Hitachi Co., Ltd. Results thus obtained are tabulated in Table 1. In Table 1, "no problem" means that all hole patterns were opened with a predetermined diameter.

TABLE 1

| | | | With Composition for Reducing Development Defects (Development: Soft Impact) | | | | | |
|---|---|---|---|---|---|---|---|---|
| | | | 1:1 | | 1:3 | | 1:5 | |
| Thickness of Resist Coating Before Development (nm) | Thickness of Resist Coating After Development (nm) | Amount of Rediction in Thickness of Resist Coating (nm) | Proper Exposure Amount (mJ/cm$^2$) | Observed Pattern | Proper Exposure Amount (mJ/cm$^2$) | Observed Pattern | Proper Exposure Amount (mJ/cm$^2$) | Observed Pattern |
| 669 | 603 | 66 | 14 | No problem | 18 | No problem | 19 | No problem |
| 682 | 618 | 64 | 13 | No problem | 18 | No problem | 18.5 | No problem |
| 688 | 622 | 66 | 13 | No problem | 18 | No problem | 19 | No problem |

TABLE 1-continued

| | | | \multicolumn{2}{c|}{1:1} | \multicolumn{2}{c|}{1:3} | \multicolumn{2}{c|}{1:5} |

With Composition for Reducing Development Defects (Development: Soft Impact)

| Thickness of Resist Coating Before Development (nm) | Thickness of Resist Coating After Development (nm) | Amount of Rediction in Thickness of Resist Coating (nm) | Proper Exposure Amount (mJ/cm$^2$) | Observed Pattern | Proper Exposure Amount (mJ/cm$^2$) | Observed Pattern | Proper Exposure Amount (mJ/cm$^2$) | Observed Pattern |
|---|---|---|---|---|---|---|---|---|
| 698 | 632 | 66 | 12.5 | No problem | 18 | No problem | 19 | No problem |
| 705 | 639 | 66 | 12.5 | No problem | 18.5 | No problem | 19.5 | No problem |
| 716 | 649 | 67 | 12.5 | No problem | 19.5 | No problem | 20 | No problem |
| 730 | 662 | 68 | 13.5 | No problem | 19.5 | No problem | 20 | No problem |
| 740 | 671 | 68 | 14 | No problem | 19 | No problem | 20 | No problem |
| 750 | 682 | 68 | 14 | No problem | 19 | No problem | 20 | No problem |
| 760 | 691 | 69 | 13 | No problem | 19 | No problem | 19.5 | No problem |
| 772 | 702 | 71 | 12.5 | No problem | 18.5 | No problem | 20 | No problem |
| 783 | 711 | 72 | 13 | No problem | 18.5 | No problem | 21.5 | No problem |
| 794 | 722 | 73 | 13.5 | No problem | 19 | No problem | 21.5 | No problem |
| 807 | 736 | 72 | 14.5 | No problem | 19.5 | No problem | 21.5 | No problem |

Comparative Example 1

Silicon wafers having coated thereon a positive-working chemically amplified photoresist with a varying thickness after baking were prepared in the same manner as in Example 1. Subsequent development, PEB and development were conducted in the same manner as in Example 1 except for not coating the composition for reducing development defects, and the wafers were observed under CD-SEM in the same manner as in Example 1. Results thus obtained are shown in Table 2. In comparison with Example 1, a number of development defects were observed. Additionally, "Opening failure was observed" means there existed some hole patterns not opened with a predetermined diameter.

Comparative Example 2

Silicon wafers having coated thereon a positive-working chemically amplified photoresist with a varying thickness after baking were prepared in the same manner as in Example 1. Subsequent development, PEB and development were conducted in the same manner as in Example 1 except for not coating the composition for reducing development defects and changing the developing method to a spraying method, and the wafers were observed under CD-SEM in the same manner as in Example 1. Results thus obtained are shown in Table 3. It is seen that, although development was conducted according to spraying method (paddle development as in Comparative Example 1) in which development defects are rather difficult to take place in comparison with the soft impact method due to more strict developing conditions employed in the spraying method, removal of development defects are still insufficient in comparison with Example 1 though better than in Comparative Example 1.

TABLE 2

Without Composition for Reducing Development Defects (Development: Soft Impact)

| Thickness of Resist Coating Before Development (nm) | Thickness of Resist Coating After Development (nm) | Amount of Reduction in Thickness of Resist Coating (nm) | Proper Exposure Amount (mJ/cm$^2$) 1:1 | Observed Pattern | Proper Exposure Amount (mJ/cm$^2$) 1:3 | Observed Pattern | Proper Exposure Amount (mJ/cm$^2$) 1:5 | Observed Pattern |
|---|---|---|---|---|---|---|---|---|
| 674 | 632 | 42 | 12 | No problem | 18.5 | No problem | 21 | No problem |
| 681 | 641 | 40 | 14.5 | No problem | 21 | No problem | 23.5 | No problem |
| 692 | 649 | 43 | 17 | No problem | 24 | No problem | 25.5 | No problem |
| 701 | 658 | 44 | 18 | No problem | 23.5 | No problem | 26 | No problem |
| 711 | 667 | 44 | 17 | Opening failure was observed | 22.5 | Opening failure was observed | 23.5 | Opening failure was observed |
| 716 | 670 | 46 | 16.5 | Opening failure was observed | 20.5 | Opening failure was observed | 21 | Opening failure was observed |
| 728 | 683 | 45 | 12.5 | Opening failure was observed | 18 | Opening failure was observed | 19.5 | Opening failure was observed |
| 739 | 694 | 45 | 12 | No problem | 20.5 | No problem | 21 | No problem |
| 749 | 703 | 46 | 14 | No problem | 21 | No problem | 23 | No problem |
| 759 | 714 | 46 | 16.5 | No problem | 23 | No problem | 25.5 | No problem |
| 771 | 725 | 46 | 18.5 | No problem | 25 | No problem | 26.5 | No problem |
| 782 | 736 | 46 | 17.5 | Opening failure was observed | 22.5 | Opening failure was observed | 25 | Opening failure was observed |
| 793 | 747 | 47 | 14.5 | Opening failure was observed | 20.5 | Opening failure was observed | 21.5 | Opening failure was observed |
| 806 | 759 | 47 | 12.5 | No problem | 20 | No problem | 20 | No problem |

TABLE 3

Without Composition for Reducing Development Defects (Development: Spraying)

| Thickness of Resist Coating Before Development (nm) | Thickness of Resist Coating After Development (nm) | Amount of Reduction in Thickness of Resist (nm) | 1:1 | | 1:3 | | 1:5 | |
|---|---|---|---|---|---|---|---|---|
| | | | Proper Exposure Amount (mJ/cm$^2$) | Observed Pattern | Proper Exposure Amount (mJ/cm$^2$) | Observed Pattern | Proper Exposure Amount (mJ/cm$^2$) | Observed Pattern |
| 667 | 632 | 35 | 11 | No problem | 17.5 | No problem | 19.5 | No problem |
| 678 | 641 | 37 | 13 | No problem | 20 | No problem | 22 | No problem |
| 684 | 649 | 35 | 15.5 | No problem | 21.5 | No problem | 23 | No problem |
| 697 | 658 | 40 | 18 | No problem | 24 | No problem | 25.5 | No problem |
| 708 | 667 | 41 | 17 | No problem | 22 | No problem | 23.5 | No problem |
| 720 | 670 | 50 | 14 | No problem | 19.5 | Opening failure was observed | 20 | Opening failure was observed |
| 731 | 683 | 48 | 12 | No problem | 18.5 | No problem | 20 | No problem |
| 741 | 694 | 48 | 12 | No problem | 19.5 | No problem | 21 | No problem |
| 752 | 703 | 49 | 14.5 | No problem | 21 | No problem | 22.5 | No problem |
| 763 | 714 | 49 | 17 | No problem | 22.5 | No problem | 25 | No problem |
| 771 | 725 | 46 | 18 | No problem | 24 | No problem | 26.5 | No problem |
| 782 | 736 | 46 | 17 | No problem | 22 | Opening failure was observed | 24 | No problem |
| 794 | 747 | 47 | 14 | Opening failure was observed | 19.5 | Opening failure was observed | 20.5 | Opening failure was observed |
| 807 | 759 | 49 | 12 | No problem | 19.5 | No problem | 21 | No problem |

Advantages of the Invention

As has been described in detail hereinbefore, the resist pattern-forming process of the present invention can form a resist pattern with good profiles which does not cause deterioration of pattern profile such as formation of T-top or round top and which, even when substrates having a diameter of 8 inches or more is used, does not cause development defects.

The invention claimed is:

1. A process for forming a resist pattern which includes: a step of forming a positive-working chemically amplified photoresist coating on a substrate having a diameter of 8 inches or more by application; a step of applying a composition for reducing development defects on the chemically amplified photoresist coating prior to exposure step; a step of baking after at least either the step of forming the chemically amplified photoresist coating by application or the step of applying the composition for reducing development defects; a step of selectively exposing the chemically amplified photoresist coating after forming the chemically amplified photoresist coating and applying the composition for reducing development defects; a step of post-exposure baking the chemically amplified photoresist coating; and a step of developing the chemically amplified photoresist coating, said composition for reducing development defects comprises an acidic composition of pH 1.5 to 4.5 containing a surfactant and where the film thickness of the chemically amplified photoresist coating after development is reduced in the range of 10 Å to 500 Å in comparison with the case of not applying the composition for reducing development defects, wherein said surfactant comprises an admixture of an organic acid and a salt and/or base, where the acid is selected from $C_4$ to $C_{15}$ perfluoroalkylcarboxylic acids, $C_4$ to $C_{10}$ perfluoroalkylsulfonic acids, and perfluoroadipic acid, where the salt is selected from ammonium salts, tetramethylammonium salts or $C_1$ to $C_4$ alkanolamine salts of $C_4$ to $C_{15}$ perfluoroalkylcarboxylic acids and $C_4$ to $C_{10}$ perfluoroalkylsulfonic acids, and the quaternary ammonium salts of perfluoroadipic acid, and, where the base is selected from an aqueous solution of ammonia and an aqueous solution of an amine; and, further where the said organic acid and the salt is at a ratio of 3:4–1:6, or the organic acid and the base is at a ratio of 7:4–7:6, both in molar ratio.

2. A composition for reducing development defects which is composed of an acidic composition of pH 1.5 to 4.5 containing a surfactant and which is to be used for the process for forming a resist pattern which includes: a step of forming a positive-working chemically amplified photoresist coating on a substrate having a diameter of 8 inches or more by application; a step of applying a composition for reducing development defects on the chemically amplified photoresist coating prior to exposure step ; a step of baking after at least either the step of forming the chemically amplified photoresist coating by application or the step of applying the composition for reducing development defects; a step of selectively exposing the chemically amplified photoresist coating after forming the chemically amplified photoresist coating and applying the composition for reducing development defects; a step of post-exposure baking the chemically amplified photoresist coating; and a step of developing the chemically amplified photoresist coating, said composition for reducing development defects comprises an acidic composition of pH 1.5 to 4.5 containing a surfactant and where the film thickness of the chemically amplified photoresist coating after development is reduced in the range of 10 Å to 500 Å in comparison with the case of not applying the composition for reducing development defects, wherein said surfactant comprises an admixture of an organic acid and a salt and/or base, where the acid is selected from $C_4$ to $C_{15}$ perfluoroalkylcarboxylic acids, $C_4$ to $C_{10}$ perfluoroalkylsulfonic acids, and perfluoroadipic acid, where the salt is selected from ammonium salts, tetramethylammonium salts or $C_1$ to $C_4$ alkanolamine salts of $C_4$ to $C_{15}$ perfluoroalkylcarboxylic acids and $C_4$ to $C_{10}$ perfluoroalkylsulfonic acids, and the quaternary ammonium salts of perfluoroadipic acid, and, where the base is selected from an aqueous solution of ammonia and an aqueous solution of an amine; and, further where the said organic acid and the salt is at a ratio of 3:4–1:6, or the organic acid and the base is at a ratio of 7:4–7:6, both in molar ratio.

3. The process of claim 1, where the composition for reducing development defects further comprises a water soluble resin.

4. The composition of claim 2, further comprising a water soluble resin.

5. The composition of claim 2, further comprising water.

6. The composition of claim 2, further comprising a water soluble solvent.

7. The composition of claim 4, where the water soluble resin is selected from poly(vinyl alcohol), poly(acrylic acid), poly(vinyl pyrrolidone), poly($\alpha$-trifluoromethylacrylic acid), poly(vinyl methyl ether-co-maleic anhydride), poly (ethylene glycol-co-propylene glycol), poly(N-vinylpyrrolidone-co-vinyl acetate), poly(N-vinylpyrrolidone-co-vinyl alcohol), poly(N-vinylpyrrolidone-co-acrylic acid), poly(N-vinyl pyrrolidone-co-methyl acrylate), poly(N-vinylpyrrolidone-co-methacrylic acid), poly(N-vinylpyrrolidone-co-methyl methacrylate), poly(N-vinylpyrrolidone-co-maleic acid), poly(N-vinylpyrrolidone-co-dimethyl maleate), poly (N-vinyl pyrrolidone-co-maleic anhydride), poly(N-vinylpyrrolidone-co-itaconic acid), poly(N-vinyl-pyrrolidone-co-methyl itaconate), poly(N-vinylpyrrolidone-co-itaconic anhydride, and fluorinated polyether.

* * * * *